United States Patent
Jones et al.

(10) Patent No.: US 6,554,687 B1
(45) Date of Patent: Apr. 29, 2003

(54) PRECISE CRYSTALLOGRAPHIC-ORIENTATION ALIGNMENT MARK FOR A SEMICONDUCTOR WAFER

(75) Inventors: Stephen H. Jones, Afton, VA (US); Thomas G. Digges, Jr., Fredericksburg, VA (US); Christopher Mark Mann, Faringdon (GB); Grant H. Ancarrow, Richmond, VA (US)

(73) Assignee: Virginia Semiconductor, Inc., Fredricksburg, VA (US)

( * ) Notice: Subject to any disclaimer, the term of this patent is extended or adjusted under 35 U.S.C. 154(b) by 0 days.

(21) Appl. No.: 09/966,321

(22) Filed: Sep. 27, 2001

Related U.S. Application Data
(60) Provisional application No. 60/236,006, filed on Sep. 27, 2000, and provisional application No. 60/236,061, filed on Sep. 27, 2000.

(51) Int. Cl.⁷ .................................................. B24C 1/04
(52) U.S. Cl. ................................................. 451/38; 451/29
(58) Field of Search ............................... 451/38, 29, 30, 451/31, 78; 125/13.01, 13.02, 12, 23.01

(56) References Cited

U.S. PATENT DOCUMENTS

| | | | |
|---|---|---|---|
| 4,232,059 A | * 11/1980 | Proffitt | 451/29 |
| 4,628,016 A | * 12/1986 | Yamaguchi | 430/30 |
| 5,439,723 A | * 8/1995 | Miyashita et al. | 428/66.7 |
| 5,883,012 A | 3/1999 | Chiou et al. | |
| 6,422,920 B1 | * 7/2002 | Bouten et al. | 451/29 |
| 2001/0020750 A1 | * 9/2001 | Chiba et al. | 257/797 |

FOREIGN PATENT DOCUMENTS

| | | | | |
|---|---|---|---|---|
| JP | 35-3027190 | * | 3/1978 | 451/78 |
| JP | 40-4261774 | * | 9/1992 | 451/38 |

OTHER PUBLICATIONS

J. Micromech. Microeng. 8 No. 4 (Dec. 1998) 327–329 Lai et al. Precise Alignment of Mask Etching with Respect to Crystal Orientation.

J. Micromech. Microeng. 6 No. 2 (Jun. 1996) 279–284; Vangbo et al; Precise Mask Alignment to the Crystallographic Orientation of Silicon Wafers Using Wet Anisotropic Etching.

Google Search Discussion Group Sep. 14, 2001; Subject Compilation: Alignment to Crystal Planes.

* cited by examiner

*Primary Examiner*—Robert A. Rose
(74) *Attorney, Agent, or Firm*—Fish & Richardson P.C.

(57) ABSTRACT

A semiconductor wafer manufactured with a precise crystallographic-orientation alignment mark and a method of manufacturing. The method of manufacturing may include forcibly directing a carrier medium containing an abrasive material through a stencil to effect abrasive impact removal of a semiconductor surface in a defined machining area. The abrasive impact removal may be part of an automated machining process.

20 Claims, 5 Drawing Sheets

PRECISE CRYSTALLOGRAPHIC-ORIENTATION ALIGNMENT MARK FOR A SEMICONDUCTOR WAFER

RELATED APPLICATIONS

This application claims the benefit of U.S. Provisional Application Ser. No. 60/236,006, filed on Sep. 27, 2000, which is hereby incorporated by reference. This application also claims the benefit of U.S. Provisional Application Ser. No. 60/236,061, filed on Sep. 27, 2000, which is hereby incorporated by reference.

BACKGROUND

The present application describes systems and techniques relating to marking of semiconductor wafers, for example, marking silicon wafers with crystallographic orientation marks.

Silicon wafers are commonly manufactured for the semiconductor industry to standard form factors and at times with laser written identification numbers. These conventions and standards have allowed the Microelectronics and Integrated Circuits industry to efficiently expand reliably over a broad base of customer markets.

Moreover, semiconductor wafers are typically manufactured from individual crystals, which each have a particular crystal lattice orientation. Generally, the crystallographic orientation of a semiconductor wafer can have significant impact on the effectiveness of certain methods of processing the semiconductor wafer and on the performance of transistors, or other devices, formed in the semiconductor wafer. Typically, semiconductor wafers are manufactured to have a particular crystallographic orientation at their surface, and a wafer flat to aid in alignment of the wafer during various processing operations.

SUMMARY

In one aspect, a method of marking a semiconductor wafer includes identifying a crystallographic orientation of a semiconductor wafer, precisely aligning the semiconductor wafer, and marking the semiconductor wafer with an embedded crystallographic-orientation alignment mark. The semiconductor wafer may be a silicon wafer, and the marking may be performed using abrasive impact removal techniques, such as by forcibly directing a carrier medium containing an abrasive material through a stencil to create the crystallographic-orientation alignment mark on the silicon wafer.

The precision alignment and the marking may be performed repeatedly as part of an automated machining process, including appropriate control systems as needed. The precision alignment may be performed using a wafer flat and a precision machined metal alignment stop. The embedded crystallographic-orientation alignment mark may encode more a than one piece of information regarding crystallographic-orientation features of the semiconductor wafer. The embedded crystallographic-orientation alignment mark may be one or more surfaces defining a line in the silicon wafer.

The embedded crystallographic-orientation alignment mark may encode information in various ways. For example, in the case of a line on the semiconductor wafer, information may be encoded in the line's orientation, length, or depth. Moreover, the embedded crystallographic orientation alignment mark may pass entirely through the semiconductor substrate.

In another aspect, a semiconductor wafer is composed of a substrate having a top surface and a bottom surface, the top surface defining a top plane with a top perimeter and the bottom surface defining a bottom plane with a bottom perimeter, and the wafer includes a surface within the top perimeter that breaks the top plane and stores information regarding a crystallographic orientation of the semiconductor wafer. Alternatively, the crystallographic-orientation information storing surface is within the bottom perimeter and breaks the bottom plane.

The crystallographic-orientation information storing surface may store multiple types of information regarding crystallographic-orientation features of the semiconductor substrate. The semiconductor wafer may also have a wafer flat. The crystallographic-orientation information storing surface may define a line in the semiconductor substrate, and information may be encoded in the line's orientation, length or depth. Finally, the crystallographic-orientation information storing surface may break both the top and bottom planes to define a hole in the semiconductor wafer.

In another aspect, a method of manufacturing semiconductor wafers includes cutting a crystal ingot comprising a semiconductor material into thin wafers, identifying a crystallographic orientation of one or more semiconductor wafers from the thin wafers, and adding a crystallographic-orientation alignment mark to each of the semiconductor wafers before distribution of the semiconductor wafers to integrated circuit manufacturers. The process of adding of the crystallographic-orientation alignment mark to each semiconductor wafer may be performed in many different manners, including, adding a wafer flat to the semiconductor wafer, aligning the semiconductor wafer against a precision machined metal alignment stop, pressing the semiconductor wafer against the precision machined metal alignment stop, and forcibly directing a carrier medium including an abrasive material through a stencil to create the crystallographic-orientation alignment mark on the semiconductor wafer in a shape corresponding to a design in the stencil.

When semiconductor wafers are manufactured with an additional marking that precisely defines the crystallographic orientation of the wafer, the wafers may be sold as an added value product, reducing the time needed to fabricate integrated circuit components during later processing. The precise alignment mark may be used during lithography to precisely align the invisible atomic arrangement of the atoms in the wafer to physical features on the wafer. This ability may be of particular importance to the micromachining, microelectromechanical device, and sensor device industries.

Moreover, this ability may be highly beneficial in orientating micromachined features via a photolithographic process to the arrangement of atoms in the semiconductor material (e.g., silicon). For example, when etching a semiconductor wafer, precise alignment of the wafer is typically critical, and having a precise crystallographic alignment mark in proximity to the etching area may provide significant aid in proper masking alignment.

DRAWING DESCRIPTIONS

Details of one or more embodiments are set forth in the accompanying drawings and the description below. Other features and advantages may be apparent from the description and drawings, and from the claims.

DETAILED DESCRIPTION

The systems and techniques described here relate to marking of semiconductor wafers, for example, marking silicon wafers with crystallographic-orientation marks. As used herein, the term "piece of silicon" (or "silicon piece") means any discrete piece of material composed predominantly of silicon, including a silicon wafer, a silicon crystal/ingot, etc., even if the discrete piece of material is coupled with another material or manufacture. Moreover, although substantial portions of this application discuss silicon in particular, the systems and techniques described here also apply to semiconductor substrates generally, including silicon/germanium, germanium, and gallium arsenide substrates.

Figure 1:
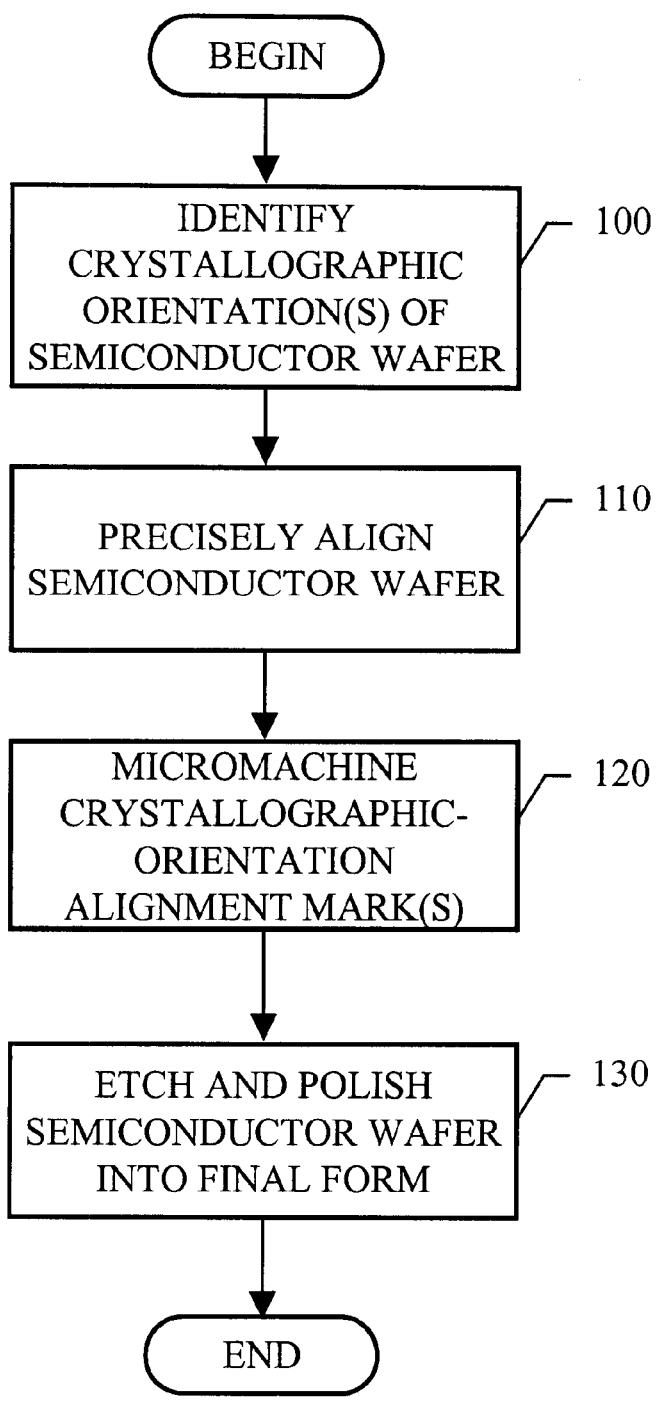
FIG. 1 is a flowchart illustrating a process for marking a semiconductor wafer with a crystallographic orientation mark.

FIG. 1 is a flowchart illustrating a process for marking a semiconductor wafer with a crystallographic orientation mark. The process begins at 100, in which one or more crystallographic orientations are identified for a semiconductor wafer.

This may be accomplished by direct measurement and analysis of the semiconductor wafer, or for example, by determining the crystallographic orientation of the wafer with respect to the wafer flat (e.g., entering a processing specification into a control system for an automated machining process). in the latter case, the wafer flat needs to have been previously manufactured with a precise orientation, such as by using X-ray analysis or other precision orientation measurement techniques.

Following 100, the semiconductor wafer is precisely aligned with respect to a machining/processing device in 110. For example, the semiconductor wafer may be mechanically aligned and pressed against a precision machined metal alignment stop.

Then in 120, one or more alignment marks are micromachined into the semiconductor wafer. The one or more micromachined alignment marks identify and delineate one or more crystallographic orientations on the semiconductor wafer. The one or more crystallographic-orientation alignment marks on the semiconductor wafer may be created using the abrasive impact removal techniques described below.

Alternatively, the method of applying the mark may include traditional machining techniques, such as laser abrasion, wet-chemical etching, reactive ion etching, etc.

In addition, the one or more crystallographic orientation alignment marks may take many different forms. For example, each mark may be a micromachined crosshair or straight line. Information may be encoded into the orientation of the mark (including orientation with respect to a wafer flat and/or orientation with respect to a wafer surface), the length of the mark, and/or the depth of the mark (including a mark that passes entirely through the semiconductor wafer).

Following 120, the semiconductor wafer is etched and polished into final form in 130. The resulting wafer has an embedded alignment feature, which a customer may use for reference in subsequent processing.

Figure 2:
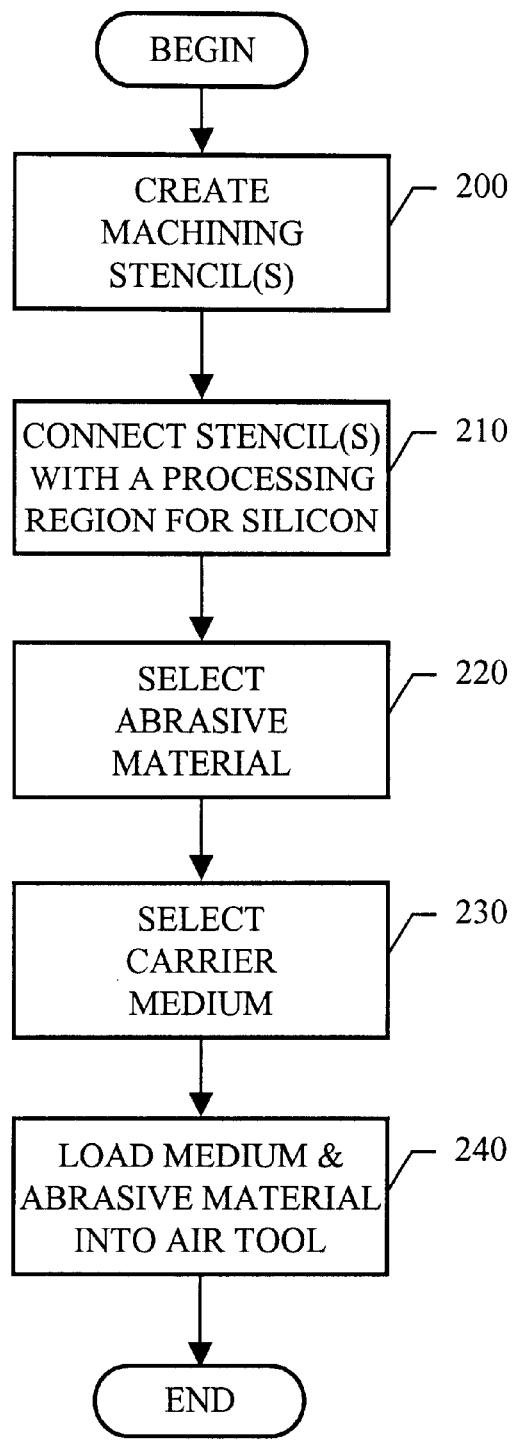
FIG. 2 is a flowchart illustrating a process for preparing an abrasive impact removal tool.

FIG. 2 is a flowchart illustrating a process for preparing an abrasive impact removal tool. The process begins at 200, in which one or more silicon machining stencils are created. The number and type(s) of stencils made in 200 depend in part on the particular application. Each stencil may be made from many types of materials, including rubber, plastic, steel, tapes, etc. In many applications, a low cost and flexible material would be preferable.

The process used for making the stencil in 200 may include one or more manufacturing techniques, including cutting and/or lithographic techniques. For example, a computer may be used to quickly and accurately design the stencil pattern and print the pattern onto a transparent foil. Then, using commercially available rubber sheets and a simple water-based photolithographic process the stencil design may be directly transferred into a rubber sheet. In this way, a thin rubber stencil is created.

Following 200, the one or more stencils are connected with a processing region in 210. For example, the stencil(s) may be installed in an abrasive impact removal (AIR) tool or suspended over a machining space where a piece of silicon is or will be located during machining. Alternatively, each stencil may simply be attached to the piece of silicon itself.

Then in 220, an abrasive material is selected; in 230, a carrier medium is selected; and in 240 the carrier medium and the abrasive material are loaded into an AIR tool. The AIR tool may be a basic "sand-blasting" tool or other comparable piece of equipment. The carrier medium may be a gas, such as air, or other carrier medium. The abrasive material may be quartz sand, purified polycrystalline silicon, silicon carbide sand, or an alternative sand-like material (e.g., any abrasive fine-grained material), and may have many alternative abrasive grits depending upon the particular application.

Figure 3:
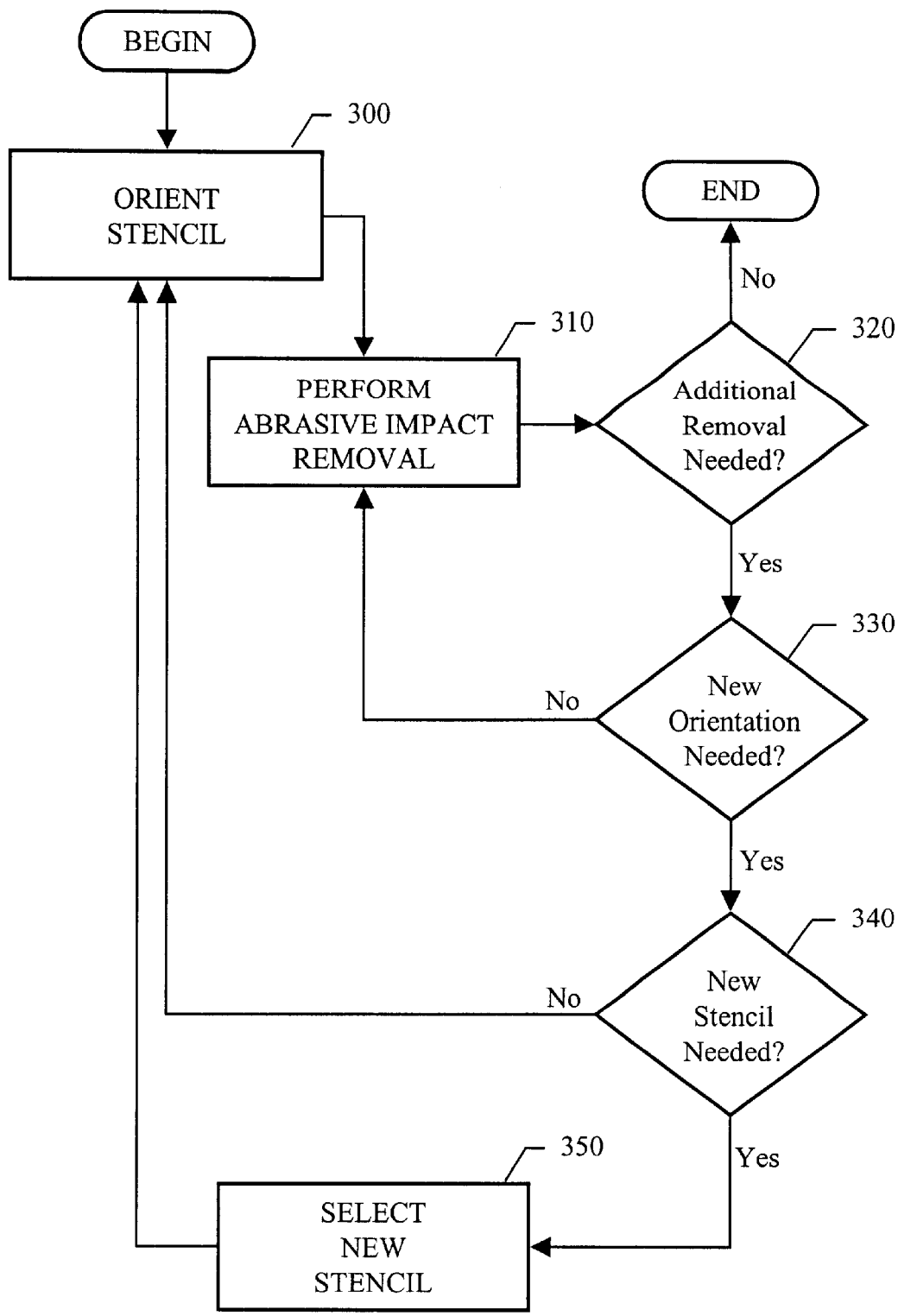
FIG. 3 is a flowchart illustrating a process for removing silicon from a piece of silicon using abrasive impact techniques.

FIG. 3 is a flowchart illustrating a process for removing silicon from a piece of silicon using abrasive impact techniques. The process begins with 300, in which a stencil is oriented with respect to a surface of a piece of silicon. The stencil is a sheet of material, as discussed above, having a desired design cut out of the sheet. The orientation may include straight-line movements, including vertical adjustments, and/or rotations. The orientation may be effected by movement of the stencil and/or by movement of the piece of silicon (e.g., by a conveyor apparatus in an automated machining process). The orientation in 300 effectively defines a machining area on the piece of silicon.

Then in 310, a carrier medium containing an abrasive material is forcibly directed through the stencil and onto the surface of the piece of silicon. This abrasive impacting of the piece of silicon is performed in 310 for a predefined period of time to selectively remove and machine the silicon surface. The abrasive impact removal of material from the piece of silicon may be performed using a basic "sand-blasting" tool.

Following this, a check is made to determine if additional removal of silicon is needed in 320. If not, the process is at an end. If so, the process continues at 330. For example, additional removal may be needed as part of an automated manufacturing process, either from the same piece of silicon or from a next piece of silicon to be machined. In 330, a check is made to determine if a new orientation is needed.

If not, the process continues at 310, where additional abrasive impact removal is performed.

For example, the process of FIG. 3 may include a controlled iterative uniform thinning of a silicon wafer. In this case, blocks 320 and 330 would include checks of the thickness of the silicon wafer, such as by using optical measuring techniques, to determine if additional removal or a reorientation is needed and/or to calculate the next predefined period of time for 310. In addition, the stencil may be such that the defined machining area includes the entire surface of the silicon wafer.

If a new orientation is determined to be necessary in 330, the process continues at 340, in which a check is made to determine if a new stencil is needed. If not, the process continues at 300, where a new stencil orientation is performed. This may be a reorientation with respect to the same piece of silicon or a new orientation with respect to a next piece of silicon. If a new stencil is determined to be needed in 340, an appropriate new stencil is selected in 350 before the process continues at 300.

The processes of FIGS. 1, 2 and 3 may be performed by hand, by machine or by combinations of both. Moreover, the process of FIGS. 1, 2 and 3 may be performed by automated equipment for processing numerous semiconductor wafers.

Figure 5A:
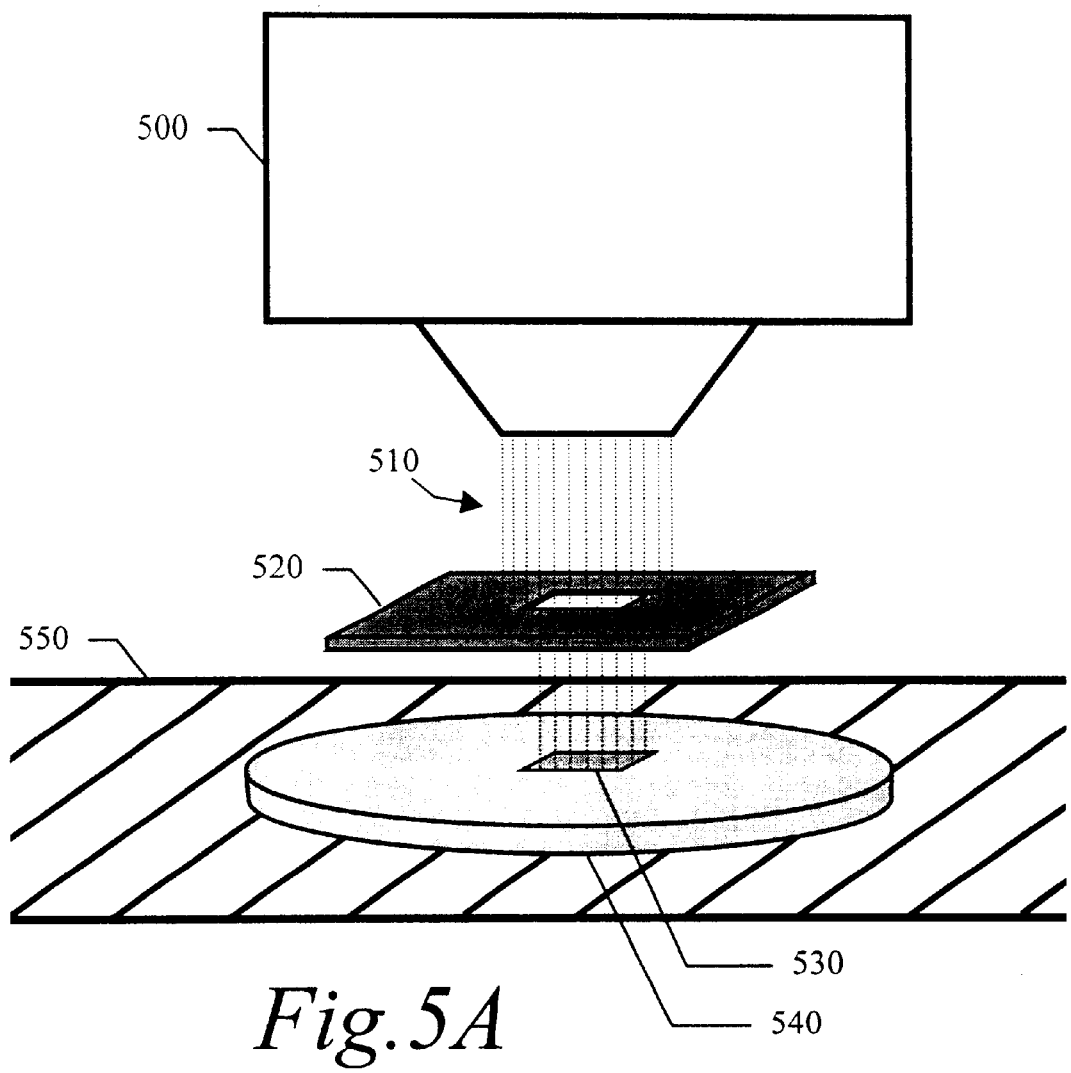
FIG. 5A is a block diagram illustrating a system for removing silicon from a piece of silicon using abrasive impact techniques.
Figure 5B:
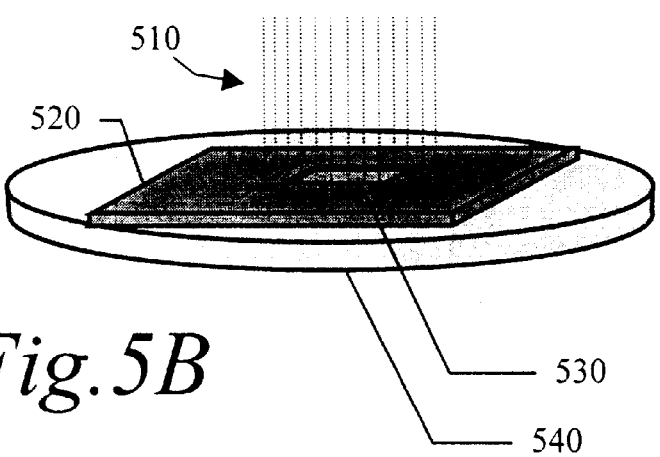
FIG. 5B is an isometric view of a portion of a system for removing silicon from a piece of silicon using abrasive impact techniques.

FIG. 5A is a block diagram illustrating a system for removing silicon from a piece of silicon using abrasive impact techniques. FIG. 5B is an isometric view of a portion of a system for removing silicon from a piece of silicon using abrasive impact techniques. An AIR tool 500 forcibly directs an abrasive material 510 onto and through a stencil 520. The stencil 520 is a sheet of material, as described above, having a desired design cut out of the sheet. Each stencil 520 may be made from many types of materials, including rubber, plastic, steel, tapes, etc.

The stencil 520 is positioned over a silicon wafer 540 such that a machining area 530 is defined on the surface of the silicon wafer 540. Typically, the stencil 520 will be positioned immediately above the silicon wafer 540, as shown in FIG. 5B, so as to keep the machining area 530 clearly defined.

The AIR tool 500 may be part of a larger automated system for processing numerous silicon wafers 540. For example, a conveyor apparatus 550 (e.g., a conveyor belt, or other devise for moving a product of manufacture in an automated machining process) may pass multiple silicon wafers 540 beneath the AIR tool 500. Each silicon wafer 540 may have its own stencil 520 attached to the silicon wafer 540.

Alternatively, the stencil 520 may be connected with the AIR tool 500 (or the conveyor apparatus 550), such that as each silicon wafer 540 comes underneath the AIR tool 500, the stencil 520 is oriented with respect to the silicon wafer 540 to define the machining area 530. For example, if each silicon wafer 540 has a wafer flat, the orientation may be performed by pressing the silicon wafer 540 against a precision machined alignment stop (e.g., a metal alignment stop).

Conveyance of the silicon wafers 540 and precision alignment of the silicon wafers 540 may be actuated by a control system as part of an automated machining process. Such a process may involve micromachining and/or be a portion of a larger manufacturing process, such as manufacturing of semiconductor, electronic, mechanical, microelectomechanical, photonic, or optical devices.

Figure 4:
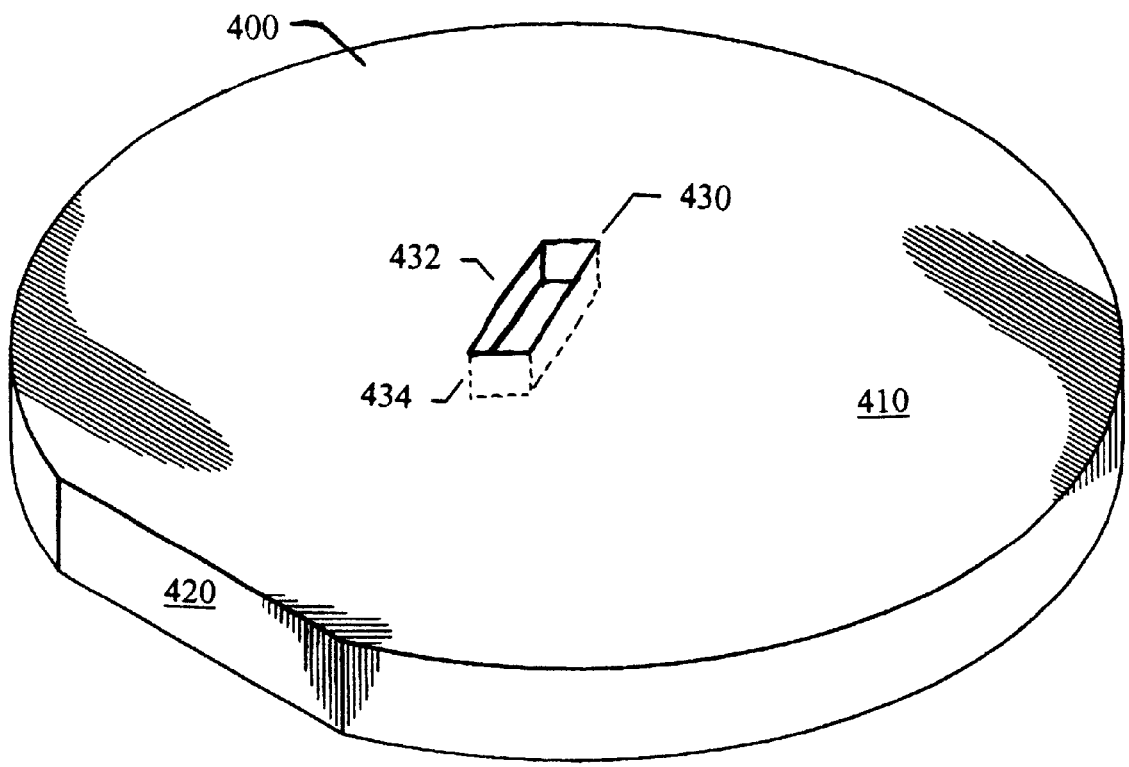
FIG. 4 is an isometric view of a silicon wafer showing an enlarged example crystallographic orientation mark machined using abrasive impact removal techniques.

FIG. 4 is an isometric view of a silicon wafer showing an enlarged example crystallographic orientation mark machined using abrasive impact removal techniques. A silicon wafer 400 has a top surface 410 and a wafer flat 420. Within the top surface 410 of the silicon wafer 400 is an example embedded crystallographic-orientation alignment mark 430. This alignment mark 430 has been substantially enlarged for the purpose of clarity, but in practice, the alignment mark 430 would generally be of a size on the order of a thousandths of a meter or smaller.

In addition, the silicon wafer 400 may be manufactured with many crystallographic-orientation alignment marks, with a crystallographic-orientation alignment mark storing multiple types of information regarding crystallographic orientation, or with a crystallographic-orientation alignment mark with different features and shapes.

The example embedded crystallographic-orientation alignment mark 430 defines a line in the silicon wafer. Information may be stored in the line's orientation, length 432, and/or depth 434. Information stored in the line's orientation may be in the line's orientation with respect to the wafer flat 420 and/or with respect to the top surface 410. Thus, the depth dimension need not be perpendicular to the top surface 410. Moreover, many interior surface layouts for the crystallographic-orientation alignment mark 430 are possible, including, for example, a surface that defines a hole in the silicon wafer 400.

Various implementations of the systems and techniques described here may be realized in digital electronic circuitry, integrated circuitry, specially designed ASICs (application specific integrated circuits) or in computer hardware, firmware, software, or combinations thereof.

The processes depicted in FIGS. 1, 2 and 3 do not require each operation or the particular order shown. Other embodiments may be within the scope of the following claims.

What is claimed is:

1. A method of marking a semiconductor wafer, the method comprising:
   identifying a crystallographic orientation of a semiconductor wafer;
   aligning the semiconductor wafer with respect to a stencil; and
   forcibly directing a carrier medium including an abrasive material through the stencil to create a crystallographic-orientation alignment mark on the semiconductor wafer in a shape corresponding to a design in the stencil.

2. The method of claim 1, further comprising repeatedly performing the alignment of the semiconductor wafer and the forcible direction of a carrier medium containing an abrasive material as part of an automated machining process.

3. The method of claim 2, wherein identifying the crystallographic orientation comprises entering a processing specification into a control system for the automated machining process.

4. The method of claim 1, wherein aligning the semiconductor wafer comprises:
   aligning the semiconductor wafer against a precision machined metal alignment stop; and
   pressing the semiconductor wafer against the precision machined metal alignment stop.

5. The method of claim 1, wherein the stencil comprises rubber.

6. The method of claim 1, wherein the crystallographic-orientation alignment mark encodes more than one piece of information regarding crystallographic-orientation features of the semiconductor wafer.

7. The method of claim 1, wherein the crystallographic-orientation alignment mark comprises one or more surfaces defining a line in the semiconductor wafer.

8. The method of claim 7, wherein the line's orientation with respect to a wafer flat encodes information.

9. The method of claim 7, wherein the line's length encodes information.

10. The method of claim 7, wherein the line's depth encodes information.

11. The method of claim 7, wherein the one or more surfaces further define a hole in the semiconductor wafer.

12. The method of claim 1, wherein the carrier medium comprises air.

13. The method of claim 1, wherein the abrasive material comprises quartz sand.

14. A method of manufacturing semiconductor wafers, the method comprising:

cutting a crystal ingot comprising a semiconductor material into thin wafers;

identifying a crystallographic orientation of one or more semiconductor wafers from the thin wafers; and adding a crystallographic-orientation alignment mark to each of the semiconductor wafers before distribution of the semiconductor wafers to integrated circuit manufacturers, wherein said adding a crystallographic-orientation alignment mark comprises:

aligning the semiconductor wafer with respect to a stencil, and forcibly directing a carrier medium including an abrasive material through the stencil to create the crystallographic-orientation alignment mark on the semiconductor wafer in a shape corresponding to a design in the stencil.

15. The method of claim 14, wherein aligning the semiconductor wafer comprises:

aligning the semiconductor wafer against a precision machined metal alignment stop; and pressing the semiconductor wafer against the precision machined metal alignment stop.

16. The method of claim 14, wherein the stencil comprises rubber.

17. The method of claim 14, wherein the crystallographic-orientation alignment mark encodes more than one piece of information regarding crystallographic-orientation features of the semiconductor wafer.

18. The method of claim 14, wherein the crystallographic-orientation alignment mark comprises one or more surfaces defining a crosshair in the semiconductor wafer.

19. The method of claim 14, wherein the carrier medium comprises air.

20. The method of claim 14, wherein the abrasive material comprises quartz sand.

* * * * *